(12) United States Patent
Shapiro

(10) Patent No.: US 7,712,325 B2
(45) Date of Patent: May 11, 2010

(54) MODULAR SEMI-CONSERVATIVE AND SELF-SCALING ELECTRONICS COOLING SYSTEM

(76) Inventor: Leonid A Shapiro, 1588 Longeaton Dr., Upper Arlington, OH (US) 43220

( * ) Notice: Subject to any disclaimer, the term of this patent is extended or adjusted under 35 U.S.C. 154(b) by 354 days.

(21) Appl. No.: 11/840,962

(22) Filed: Aug. 18, 2007

(65) Prior Publication Data

US 2009/0044545 A1    Feb. 19, 2009

(51) Int. Cl.
| F25D 23/12 | (2006.01) |
| F28D 5/00 | (2006.01) |
| F28D 15/00 | (2006.01) |
| F28C 1/00 | (2006.01) |
| H05K 7/20 | (2006.01) |
| B01F 3/04 | (2006.01) |
| F28F 7/00 | (2006.01) |

(52) U.S. Cl. ............... 62/259.2; 62/314; 62/315; 361/688; 261/92; 261/107; 165/907; 165/80.3; 165/80.4; 165/104.14

(58) Field of Classification Search ............ 62/314, 62/315, 259.2; 361/688, 687; 261/92, 107; 165/907, 80.3, 80.4, 104.14
See application file for complete search history.

(56) References Cited

U.S. PATENT DOCUMENTS

| 3,490,718 | A | * | 1/1970 | Vary | 244/171.8 |
| 4,594,860 | A | * | 6/1986 | Coellner et al. | 96/118 |
| 5,651,414 | A | * | 7/1997 | Suzuki et al. | 165/104.14 |
| 6,176,098 | B1 | * | 1/2001 | Moriguchi | 62/259.2 |
| 6,561,267 | B2 | * | 5/2003 | Sauciuc et al. | 165/185 |
| 6,832,753 | B1 | * | 12/2004 | Huang | 261/28 |
| 6,854,278 | B2 | * | 2/2005 | Maisotsenko et al. | 62/94 |
| 6,966,359 | B1 | * | 11/2005 | Liu | 165/104.21 |
| 7,044,199 | B2 | * | 5/2006 | Thayer et al. | 165/80.4 |
| 7,050,707 | B1 | * | 5/2006 | Lin | 392/360 |
| 7,131,486 | B2 | * | 11/2006 | Goodson et al. | 165/80.4 |
| 7,503,512 | B2 | * | 3/2009 | Nakada et al. | 239/690.1 |
| 2004/0040328 | A1 | * | 3/2004 | Patel et al. | 62/259.2 |
| 2005/0160752 | A1 | * | 7/2005 | Ghoshal et al. | 62/259.2 |
| 2007/0044941 | A1 | * | 3/2007 | Kuo | 165/80.3 |

* cited by examiner

*Primary Examiner*—Cheryl J Tyler
*Assistant Examiner*—Filip Zec

(57) ABSTRACT

A modular electronic cooling system with moving parts, composed of a base unit and individual modules inserted into this base unit in respect to the expected upper limit of the heat load may utilize thermoelectric power generation and the heat load itself to allow for operation independent of any external power source. By the same mechanism the cooling system scales within a range automatically reacting to and dissipating a dynamic heat load via forced convection, and doing so passively, without the need for specific programming. This cooling system uses porous material or multi-layered mesh parts, thermoelectric components, a modular assembly system and independent enclosure parts for described porous material or multi-layered mesh, an electronics control system that may be passively activated, and a motor assembly. Altogether the system provides maximum efficiency in terms of form factor.

3 Claims, 6 Drawing Sheets

Cooling cells = 1
Note : best - fit curve is shown

Cooling cells = 2
Note : best - fit curve is shown

Cooling cells = 3
Note : best - fit curve is shown

MODULAR SEMI-CONSERVATIVE AND SELF-SCALING ELECTRONICS COOLING SYSTEM

FIELD OF THE INVENTION

The presented invention relates to the dissipation of a dynamic heat load from a cooled surface, specifically for application in electronics cooling.

BACKGROUND OF THE INVENTION

In the microprocessor industry, formerly each next iteration of a product used to be characterized by noticeably better performance due to significant increases in both clock speed and part count. Each next product generation also had greater power consumption, and consequently, increased heat output [Chen, C., and Lu, T. J. *Thermal Transport and Fire Retardance Properties of Cellular Aluminum Alloys*. Acta Mater, 1999, vol. 47(5)]. This necessitated the application of more powerful cooling systems.

Heat-sinks had to be increased in size and forced convection replaced passive cooling, adding a fan to every heat-sink [Republic of Korea Patent No. KR20030085737]. Mesh or foam heatsinks, and microchannels are being studied, and although when compared with a standard finned heatsink they exhibit better use of space. A forced convection heat dissipating potential of the heat sink alone is still inadequate for potential heat output of modern and future microprocessors, and like devices [U.S. Pat. No. 7,219,715]. Improvements in thermal pastes, packaging, and heat spreading continued, but the next big step was debated [Wilson J. and Guenin B. *Cooling solutions in the past decade*, Electronics Cooling, 2005, vol. 11(4)]. Popular leaps contemplated included the use of mediums besides air, namely water, low-boiling point hydrocarbons, liquid metals and alloys, and cryogens [Lasance, Clemens J. M. and Simons R. E. *Advances in high-performance cooling for electronics*, Electronics Cooling, 2005, vol. 11(4)].

Heat-sinks incorporating thermoelectric elements and similar schemes are already available on the market, and despite being solid-state units, are nevertheless not widely used due to limited heat dissipation relative to power consumption [US Patent Application Publication No. 2007/0079615]. Heat-sinks incorporating thermosyphons, where refrigerants are boiled at a higher than ambient temperature and then passively condense, are widely used as aftermarket heat-sink products (that are not usually bundled with electronics components.) For heat pumping from an enclosed space to another point in the system, or for better area-of-effect heat spreading from a point, these systems allows for complex heat sinking assemblies and better heat dissipation relative to power consumption, at an additional monetary cost [U.S. Pat. No. 7,149,086].

The boiling of cryogens displays greatest heat dissipation versus time [U.S. Pat. No. 7,243,507]. Unfortunately, it is often challenging to offer the equipment needed for that type of setup outside an industrial setting; cost of items, cost of use, skill to maintain, and system bulk are prohibitory [U.S. Pat. No. 6,070,414]. That a cycled cryogenic cooling system is preferable in such circumstances is a further complication [U.S. Pat. No. 5,647,217 and U.S. Pat. No. 5,333,460]. The same, to a lesser degree, can be said to have stalled the total widespread use of relatively more affordable water cooling and refrigeration. In a mandatory mass deployment (of the new cooling equipment), by computer system builders the service cost alone would alienate much of the end-user market, and yet, available so-called mainstream alternatives that could be bundled with products were inherently limiting.

In response, hardware manufacturers adopted a new production process strategy: to increase the overall number of processors while lowering clock speed per processor [U.S. Pat. No. 7,043,405]. With heightened precision of manufacturing, this strategy was swiftly realized in the form of so-called multi-core processors, where multiple otherwise self-contained processors, or cores as they are called, exist on a single processor die. Provided the continued support of the software sector, the practice appears to have thus far been successful.

Regardless, whether clock speed increases or increases in part count through an increase in the number of processor cores, increased heat output is eventually unavoidable if there is to a an increase in performance. Besides a consumer's demand for greater performance, there is also a continued demand for mobility, which are goals at opposite ends of a spectrum when concerned with electronics cooling. Furthermore, whereas high power consumption is common in the workstation or server application, it is unacceptable in mobile platforms, where the conflict may not necessarily lay in the cost of use but more so in that access to a sufficient power source is likely impossible.

OBJECTIVES OF THE INVENTION

The overall objective of this invention is to allow for effective dissipating of a large heat load from the surface of an electronic device.

For increasing heat dissipation relative to power consumption without increasing the risk of failure, the cooling system must adapt to a rapidly and constantly changing heat load.

For further purposes of greater form factor flexibility it is necessary to separate the cooling system as a self-contained component, going as far as eliminating dependence on any external power source. Instead, it is proposed that the cooling system derive power from the heat load itself through the use of a solid state technology. This would also guarantee reliability in all circumstances.

SUMMARY OF THE INVENTION

The invention presented herein accomplishes these of objectives by the use of a modular architecture that scales in two ways: by configuration or automatically. Power generation is provided by thermoelectric materials situated near the heat load. Multiple cooling cell modules are inserted into this base module in respect to the expected upper limit of the heat load to be present at the cooled surface.

The cooling cell modules comprise of a naturally or artificially assembled porous material or mesh structure, and a casing that covers the porous material or mesh structure from ambient surrounding while allowing a single medium to pass through. The porous material is rotated through an ambient or artificially introduced medium that removes heat from the cooling system into the ambient environment. Through greater rates of rotation there is greater surface area exposure. This is coordinated with the heat load to remove the heat load into the ambient environment with maximum efficiency.

DETAILED DESCRIPTION AND PREFERRED EMBODIMENTS OF THE INVENTION

Figure 1:
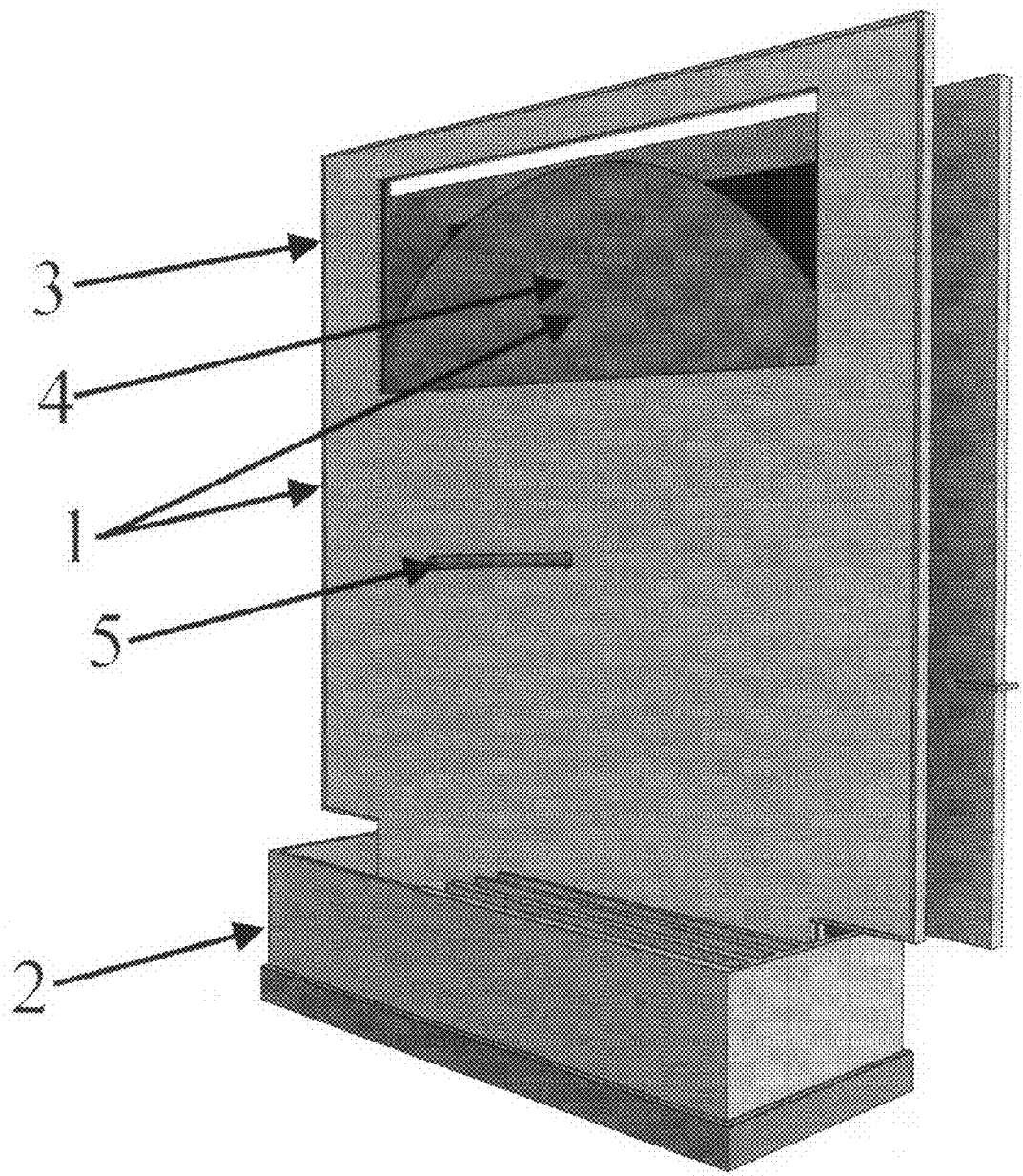
FIG. 1 is a view of the invention from the front. A cooling cell module 1 is shown inserted into a base module 2.
Figure 2:
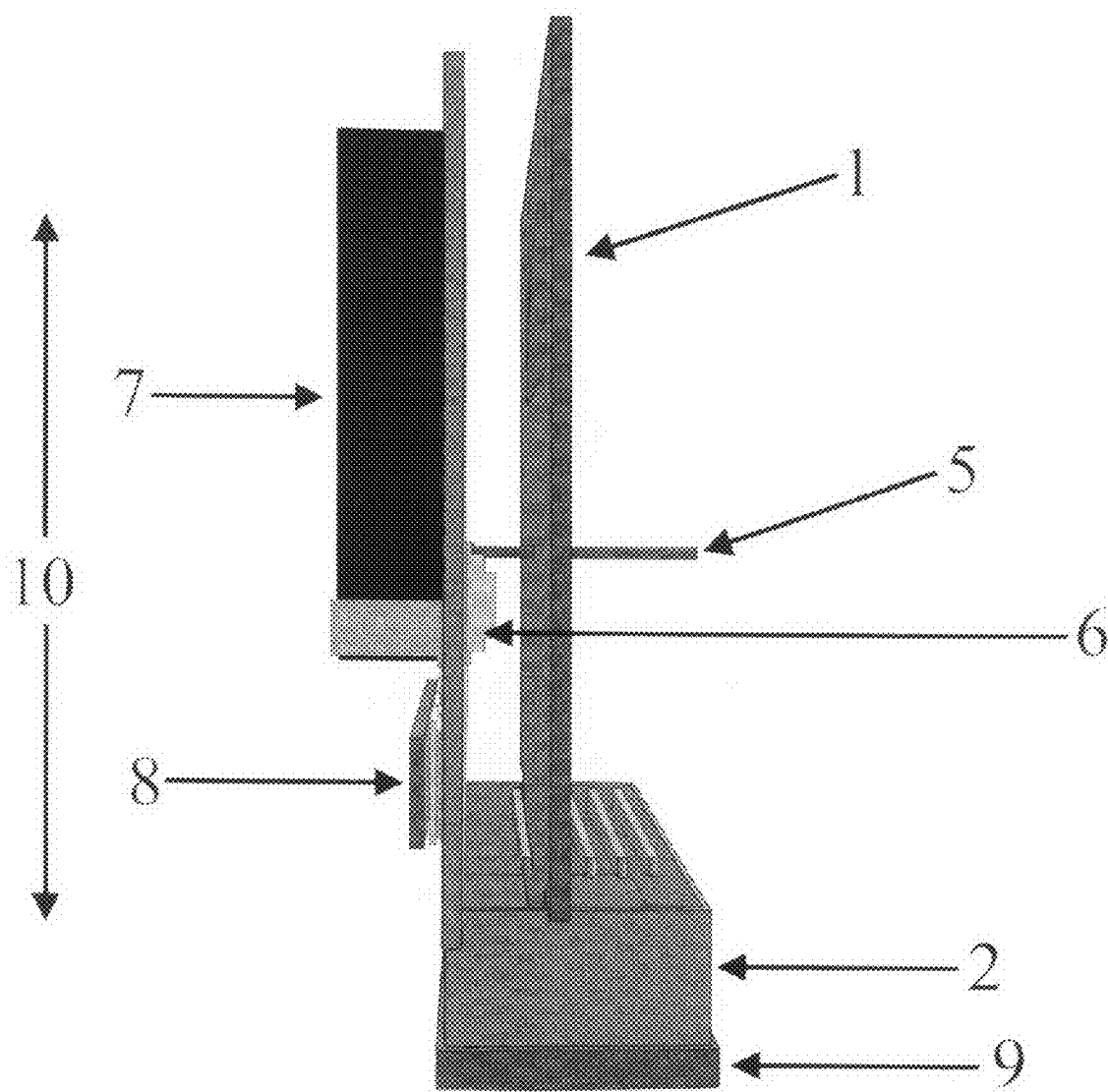
FIG. 2 is a view of the invention from the side. A cooling cell module 1 is shown inserted into a base module 2.
Figure 3:
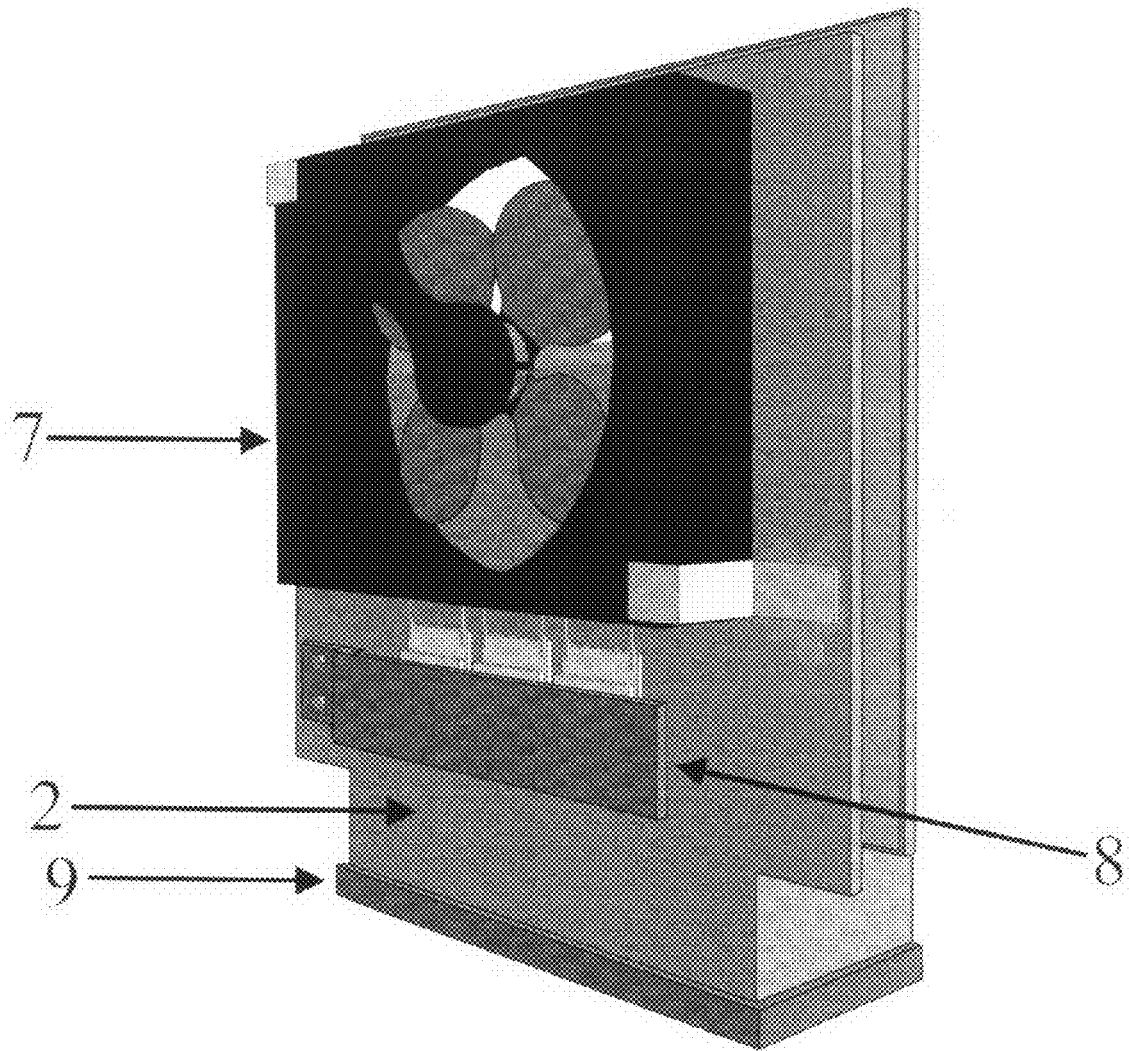
FIG. 3 is a view of the invention from the back. A cooling cell module 1 is shown inserted into a base module 2.

The invention is in the form of a two-part system, comprising of flat cooling cells 1, which are inserted into a base module 2 that is positioned upon the surface 9 being cooled.

Each cooling cell consists of a casing 3 and a circular layered porous metallic material part 4. Analyzed, porosity in a material reduces volume while increasing surface area in a finite space. If assembled for minimal air turbulence a porous material 4 is the best possible medium for convective heat transfer.

The porous material part 4 becomes hot very quickly, but it also cools very quickly, over time offloading large quantities of heat into the ambient atmosphere 10. Each cooling cell 1 inserted into the base module 2 is fitted on an axle 5, which penetrates cooling cell 1 casing 3 and locks into the disk-shaped porous material part 4 within. This axle 5, turned by a motor or a like mechanism 6, rotates.

A section of each porous material part 4, as it is situated inside the cooling cell 1, is submerged in a thermally conductive fluid contained within the lower cavity of the base module 2. This fluid medium is replaced eventually. A forced convection inducing part 7, such as a standard brushless axial fan, pulls air. Heating occurs along one half of the total surface area of the porous material part 4, and the other half of the porous material part 4 approaches ambient temperature.

Thermoelectric generator modules 8 arrayed on the base module generate power for the cooling system from the heat differential between the ambient environment 10 and the base module 2. Required voltage manipulations are performed by onboard circuitry, and power is stored in a capacitor. Active support electronics are consolidated into the body of the base module 2, conserving space, and lowering manufacture costs.

As power available to the cooling system is derived from the heat load conducted through the base module 2, which depends on the heat load at the cooled surface 9, a scaling effect is indirectly produced. Rate of rotation, exchange of warm sections for cool sections, gives greater surface exposure per unit of time. When the heat load increases the porous material part 4 rotates faster, stabilizing the temperature at the cooled surface 9 unless the heat load at the cooled surface 9 continues increasing.

Self-scaling of this sort is limited by the finite rate of conductive heat transfer through the porous material part 4. Heat removed at the base module 2 must have enough time to fully conduct through the nearby material before the heated porous material part 4 section is in position to be cooled at the forced convection inducing part 7, else useful heat transfer ceases. Overcoming this involves the modular aspect of the system; if the peak expected heat load at the cooled surface 9 is known to be greater than that which a single cooling cell 1 can dissipate, an additional cooling cell 1 may be added into the system through insertion into the base module 2.

Example of Concept Application

A cooling system of this design was successful at dissipating up to a 0.5 kW heat load when three cooling cells were used and when accommodations were met for sufficient non-circulated airflow. Each cooling cell in this test contained a 90 mm diameter aluminum sponge with a thickness of 2 mm, and average pore diameter of 1.5 mm. Water and petroleum ethers were tested as thermal transfer fluid. An off-the-shelf 80 mm by 80 mm by 25 mm brushless DC axial fan spinning at a maximum of 2500 rpm was used for airflow. The heat load, generated by a wire coil, was concentrated to an area of 2×2 cm.

Total power consumption by this cooling system was little over 3 W at maximum fan speed and axle rotation, and required voltage manipulations are performed by onboard circuitry, and power is stored in a capacitor. Four 350 W high temperature thermoelectric modules, with $Bi_2Te_3$ junctions, cooled on the cold side by passive aluminum heat sinks built into base module body, provided power generation.

Wetting of the sponge by fluid contained within the base was prevented by the use of aluminum material for cooling cell casing and sponge material. Other methods to reduce wetting include adding an inhibiting agent into the thermal transfer fluid, specialized casing coating, or different combinations of thermal transfer fluid and cooling system part material. With minimal displacement of fluid from the base, evaporation or loss of the fluid in a manner otherwise was almost negligible.

Figure 4:
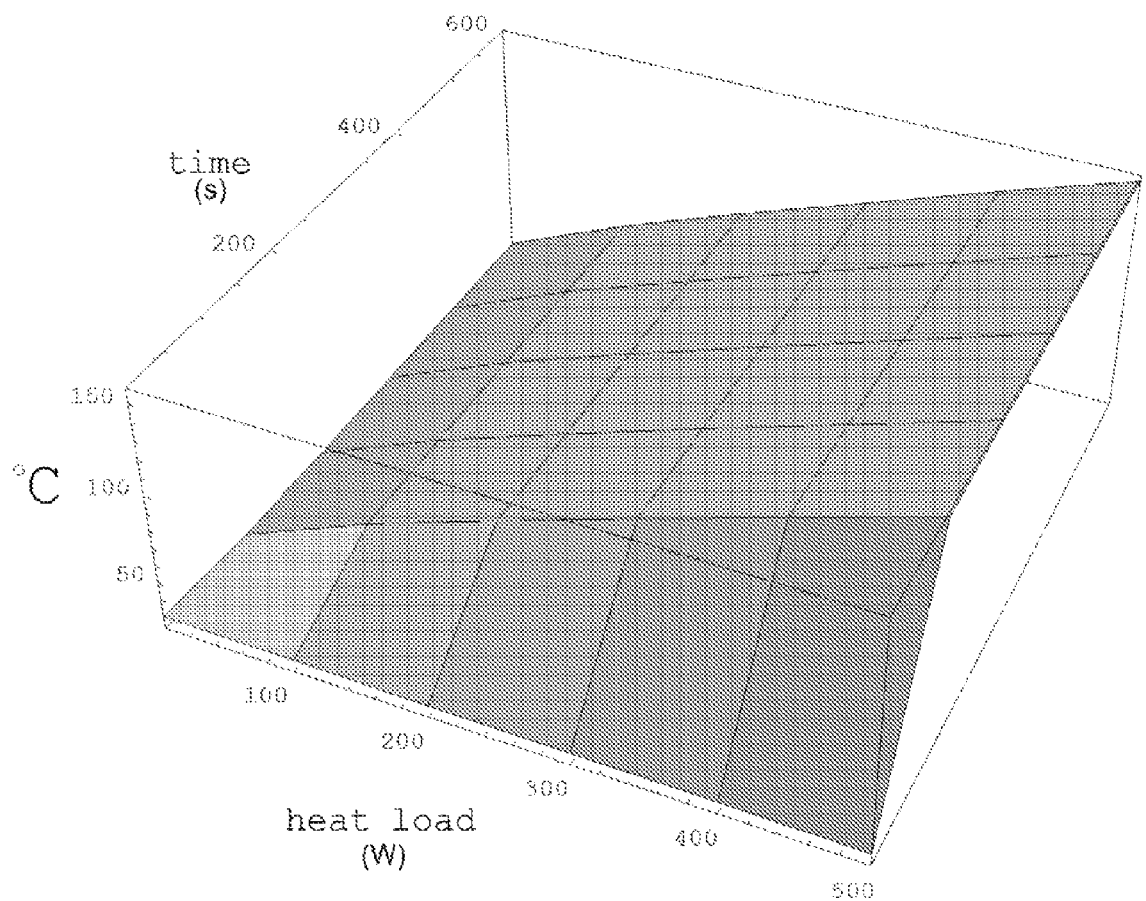
FIG. 4 is a chart of the average performance of a herein specified build of the invention in its intended application. One cooling cell module 1 in conjunction with the base module 2 is used to dissipate variable increasing heat loads from a said surface.
Figure 5:
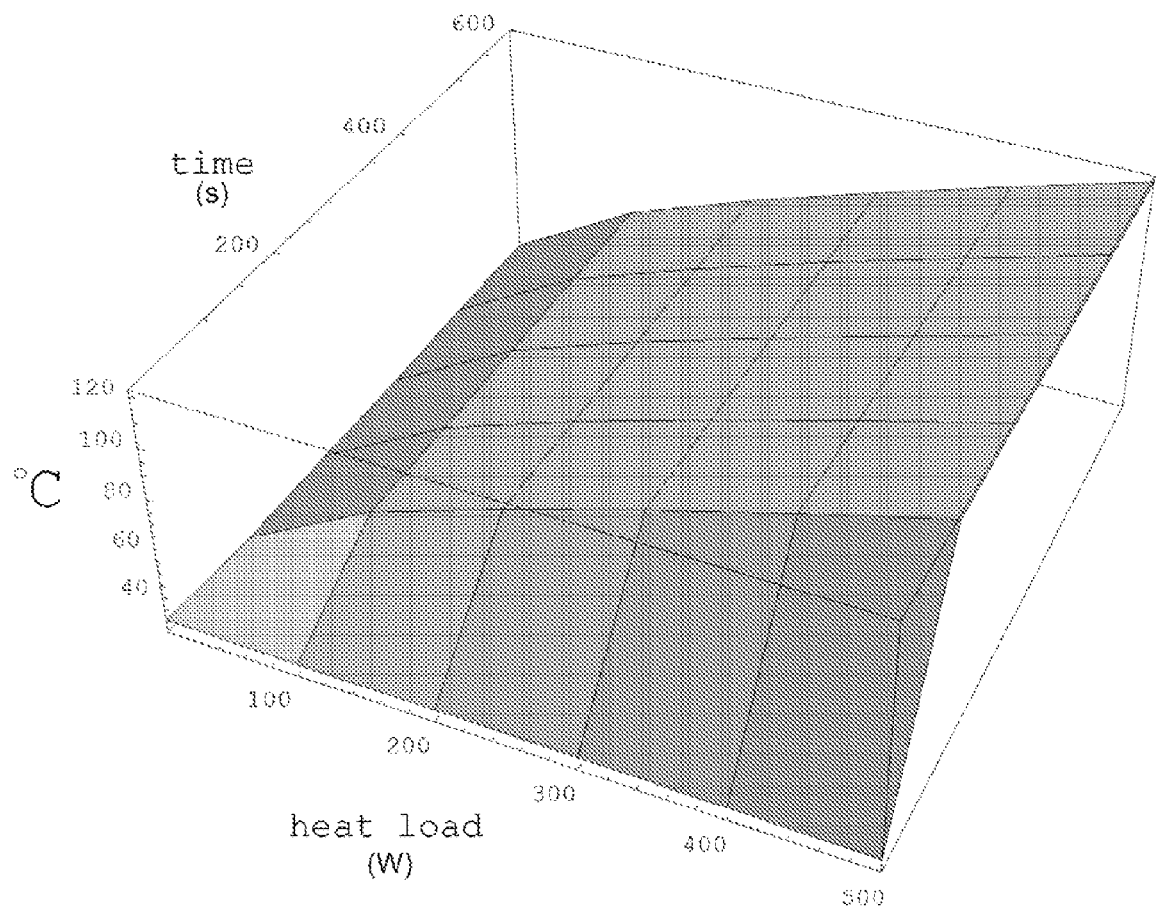
FIG. 5 is a chart of the average performance of a herein specified build of the invention in its intended application. Two cooling cell modules 1 in conjunction with the base module 2 are used to dissipate variable increasing heat loads from a said surface.
Figure 6:
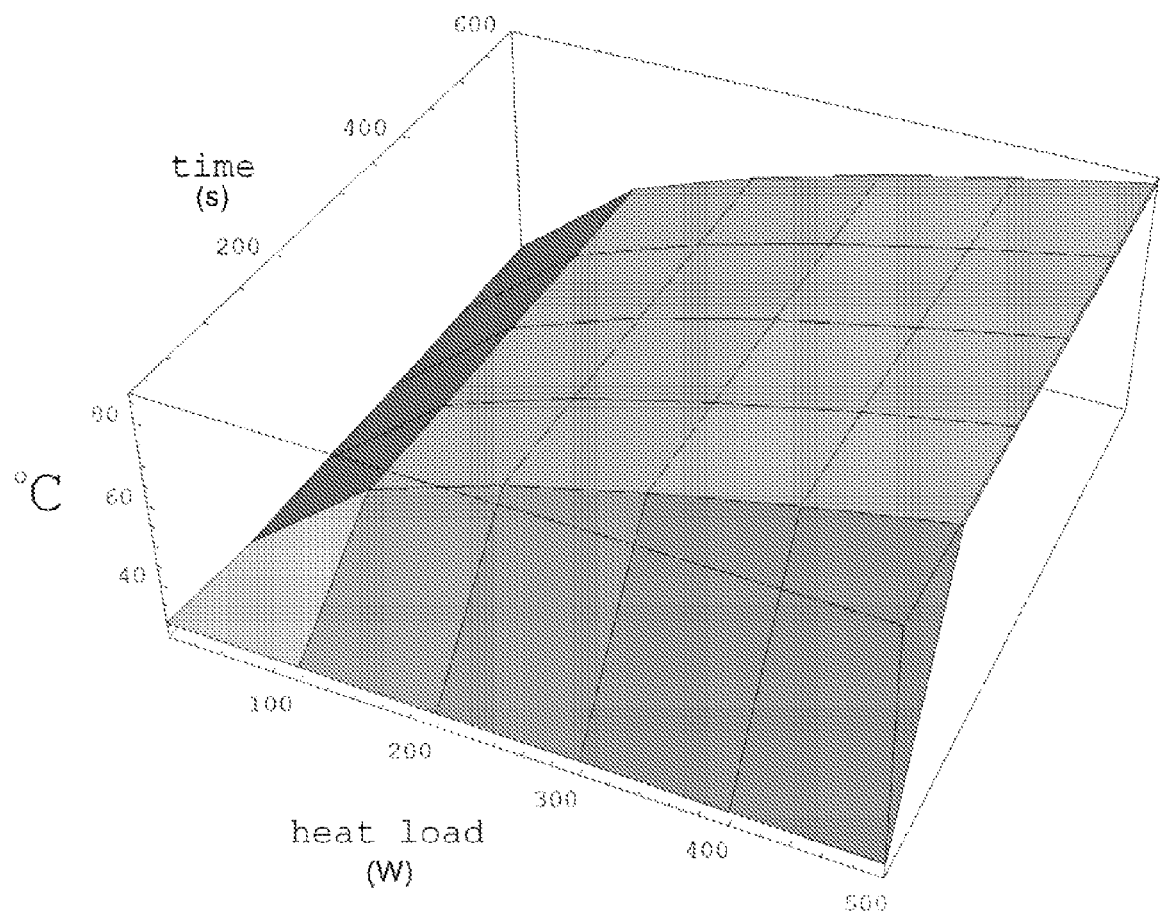
FIG. 6 is a chart of the average performance of a herein specified build of the invention in its intended application. Three cooling cell modules 1 in conjunction with the base module 2 are used to dissipate variable increasing heat loads from a said surface.

Refer to FIG. 4, FIG. 5, and FIG. 6 for details of performance with system described herein containing one, two, or three cooling cells respectively. Both charts display the average of multiple trials.

What is claimed is:

1. A modular semi-conservative and self-scaling electronics cooling system comprising of:

a base module applied to a cooled surface or cooled surfaces, one or more cooling cell modules with developed surface area that are inserted into the said base module, whereby the number of cooling cells is adjustable to the required heat sink capacity, and each cooling cell comprises of a naturally or artificially assembled porous material or mesh structure and a casing that covers, at least partially, the porous material or mesh structure from ambient surrounding while allowing a single medium to pass through;

an active forced convection inducing at least one part that pushes or pulls an ambient, or artificially introduced medium through any cooling cell at least one module inserted into the said base module, mechanisms controlling operation of said forced convection inducing at least one part and cooling cell module(s) necessarily comprising of a mechanism that distributes power to said forced convection inducing at least one part, and a mechanism that rotates the naturally or artificially assembled porous material or mesh structure within cooling cell casing, and a fluid medium contained within the said base module.

2. The modular semi-conservative and self-scaling electronics cooling system according to claim 1, whereby the base module also contains:

an array of thermoelectric generator modules that is mounted within the structure of the base module, a current regulation circuit that connects between the array of thermoelectric generator modules and the forced convection inducing at least one part, a current regulation circuit that connects between the array of thermoelectric generator modules and a mechanism that rotates a naturally or artificially assembled porous material or mesh structure within a cooling cell casing.

3. A specific build of modular semi-conservative and self-scaling electronics cooling system according to claim 1, whereby:

the surface of the base module to contact the cooled surface is made of aluminum, copper, or silver, the fluid medium contained in the said base module is matched to base module material based on wetting characteristics, where most limited wetting is preferable, the array of thermoelectric generator modules is placed within the structure of the base module near the surface of the base module to contact the cooled surface, a cooling cell module casing contains an opening straight through the cooling cell module, the total heat-sinking area of the cooling cell module casing is larger than the area of cooled surface by at least the factor of 8.5, a porous material or mesh structure contained within the cooling cell module is made in the form of a disk, manufactured from aluminum, copper, or silver foam, net, or wires, and assembled in multiple layers whereby the ratio of the surface area of this disk to the area of the cooled surface is $\geq 20:1$, and a rate of rotation of said disk in any single cooling cell module is within the range of 0 to 30 rpm, provided by a mechanism that distributes power to said forced convection inducing at least one part, and a mechanism that rotates the naturally or artificially assembled porous material or mesh structure within cooling cell casing.

* * * * *